(12) United States Patent
Stipe

(10) Patent No.: US 6,771,534 B2
(45) Date of Patent: Aug. 3, 2004

(54) THERMALLY-ASSISTED MAGNETIC WRITING USING AN OXIDE LAYER AND CURRENT-INDUCED HEATING

(75) Inventor: Barry C. Stipe, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/295,678

(22) Filed: Nov. 15, 2002

(65) Prior Publication Data

US 2004/0095801 A1 May 20, 2004

(51) Int. Cl.$^7$ .......................... G11C 11/00; G11C 11/14
(52) U.S. Cl. .................. 365/158; 365/171; 365/173
(58) Field of Search ........................ 365/158, 171, 365/173

(56) References Cited

U.S. PATENT DOCUMENTS 5,289,410 A * 2/1994 Katti et al. ................. 365/173
6,174,737 B1 * 1/2001 Durlam et al. .............. 365/171
6,340,533 B1 * 1/2002 Ueno et al. ................. 365/158
6,545,896 B1 * 4/2003 Munden et al. ............. 365/173

* cited by examiner

Primary Examiner—Trong Phan
(74) Attorney, Agent, or Firm—McGinn & Gibb PLLC; Thomas Berthold, Esq.

(57) ABSTRACT

A method and structure for a non-volatile magnetic random access memory (MRAM) device that has a stable magnetic electrode, an oxide layer adjacent the stable magnetic electrode, and a free magnetic electrode. The oxide layer is between the stable magnetic electrode and the free magnetic electrode. In the invention, a conductor is connected to a stable magnetic electrode. The oxide layer has a resistance at levels to allow sufficient power dissipation to lower the anisotropy of the free magnetic electrode through current induced heating. Current-induced heating is used in combination with spin-transfer torque or a magnetic field to switch the free magnetic electrode.

29 Claims, 2 Drawing Sheets

THERMALLY-ASSISTED MAGNETIC WRITING USING AN OXIDE LAYER AND CURRENT-INDUCED HEATING

BACKGROUND OF THE INVENTION

1. Field of the Invention

The present invention generally relates to thermally-assisted magnetic writing and more particularly to current-induced heating in magnetic random access memory devices.

2. Description of the Related Art

The non-volatile memory chip market is today dominated by Flash technology. Unfortunately, Flash is very slow and has a very limited number of write cycles (about $10^6$) before failure, making it unsuitable as a replacement for volatile memories such as DRAM or SRAM. It is also believed to have limited scalability beyond the 65 nm technology node. Therefore, there is a need for a new type of non-volatile memory.

SUMMARY OF THE INVENTION

The invention provides a non-volatile magnetic random access memory (MRAM) device that has a stable magnetic electrode comprising of one or more layers, an oxide layer, and a free magnetic electrode comprising of one or more layers. When the oxide is used as a barrier, the stable and free magnetic electrodes are adjacent to the oxide. In the oxide design with holes, there can also be a nonmagnetic spacer metal between the two electrodes. The oxide layer is between the stable magnetic electrode and the free magnetic electrode. In the invention, a conductor is connected to a stable magnetic electrode. The oxide layer has a resistance at levels to allow sufficient power dissipation to occur to lower the magnetic anisotropy of the free magnetic electrode through current induced heating. Current-induced heating is used in combination with spin-transfer torque or a magnetic field to switch the free magnetic electrode. The stable magnetic electrode is thicker or has higher magnetic anisotropy than the free magnetic electrode.

In the invention, a transistor is used to control whether current passes between the free magnetic electrode and the stable magnetic electrode. The current induced heating only temporarily lowers the anisotropy until the free magnetic electrode is switched. The resistance and thermal properties of the oxide layer are optimized to temporarily reduce the anisotropy of the free magnetic electrode through the current-induced heating. A material selection for the free magnetic electrode is optimized to have an increased reduction in anisotropy for a small temperature change to allow the current density needed for switching to be reduced during writing. The invention provides a non-volatile MRAM memory device with a large number of read and write cycles, current-controlled switching, excellent scalability, ultra-fast switching speeds, very small bit cell, low voltage, low power, and optimal resistance for CMOS integration The invention also provides a method of manufacturing a non-volatile magnetic random access memory (MRAM) device. The invention first forms a stable magnetic electrode. The invention then forms an oxide layer on the stable magnetic electrode and forms a free magnetic electrode on the oxide layer so that the oxide layer is between the stable magnetic electrode and the free magnetic electrode. The oxide layer is formed to have a resistance at levels to allow sufficient power dissipation to heat the free magnetic electrode to lower anisotropy of the free magnetic electrode through current induced heating. The heating can assist in switching the free magnetic electrode to write information in the MRAM device and can reduce the current density required to a value lower than that required in the absence of the heating. The forming of the stable magnetic electrode forms one or more layers. The heating current is spin-polarized and occurs at a level to allow spin-transfer-based writing to occur in the free magnetic electrode. The invention can form bit and word lines connected to the free magnetic electrode and the stable magnetic electrode. The heating current in combination with magnetic field from current passing through the bit and word lines switches the free magnetic electrode. The invention forms an oxide layer which has thermal properties. The resistance and thermal properties are optimized to temporarily reduce the anisotropy through the current-induced heating. A material selection for the free magnetic electrode is optimized to have an increased reduction in anisotropy for a small temperature change to allow a critical current density to be reducing during writing of the information.

BRIEF DESCRIPTION OF THE DRAWINGS

The foregoing and other objects, aspects and advantages will be better understood from the following detailed description of a preferred embodiment(s) of the invention with reference to the drawings, in which.

DETAILED DESCRIPTION OF PREFERRED EMBODIMENTS OF THE INVENTION

Figure 1:
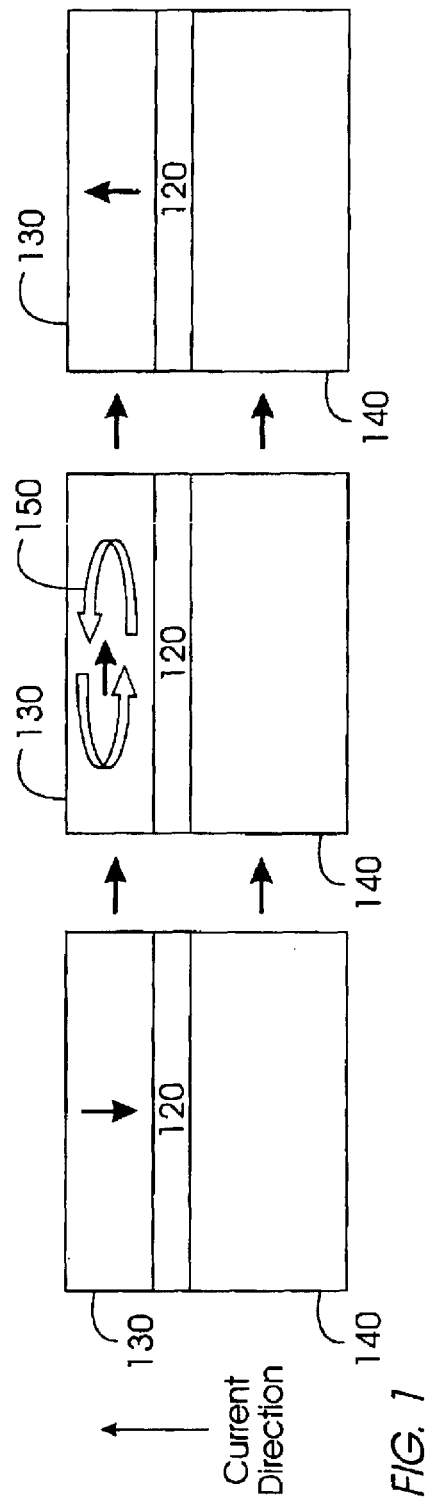
FIG. 1 is a schematic diagram of a magnetic random access memory structure.

With the invention, thermally-assisted magnetic writing is accomplished by passing current through an ultra-low resistance oxide layer adjacent or near to a free electrode to be switched. Current-induced heating lowers the anisotropy of the free electrode and reduces the current density required for field or spin-transfer-based writing. In one embodiment of the invention, the resistance through the oxide layer in on the order 4 $\Omega$-$\mu m^2$, the free electrode is comprising of $Tb_xFe_y$ based alloy, and switching is induced by spin-transfer torque with thermal assist. Thus, the invention provides a non-volatile MRAM memory device with a large number of read and write cycles, current-controlled switching, excellent scalability, ultra-fast switching speeds, very small bit cell, low voltage, low power, and optimal resistance for CMOS integration.

As mentioned above, the non-volatile memory chip market is today dominated by Flash technology. Unfortunately, Flash is very slow and has a very limited number of write cycles (about $10^6$) before failure, making it unsuitable as a replacement for volatile memories such as DRAM or SRAM. It is also believed to have limited scalability beyond the 65 nm technology node. Two primary emerging memory technologies are phase-change (also known as Ovonic Universal Memory—OUM) and magnetic random access memory (MRAM) using magnetic tunnel junctions MTJs. OUM uses the high and low resistance states of phase change media (amorphous versus crystalline) to store bits while MRAM uses the high and low resistance states of a MTJ (parallel versus anti-parallel magnetic electrodes) to store bits.

OUM writing is accomplished by passing high current through the media to bring the material to the crystallization temperature or melting temperature (about 700 to 900 K). Rapid cooling of the melted media results in the amorphous (high resistance) phase. Writing the crystalline phase requires a longer time for nucleation and growth to occur. MTJ-MRAM writing is accomplished by passing current through word and bit lines to create a magnetic field strong enough for switching of the "soft" or "free" magnetic electrode at the cross point of these lines.

There are numerous disadvantages to both OUM and MTJ-MRAM technologies. For OUM, write times are rather slow (about 50 ns) due to the crystallization period required and has limited write cycles (about 1013) due to the repeated melting of the media MTJ-MRAM can be more than ten times faster and can have an almost unlimited number of write cycles. However, MTJ-MRAM may suffer from a large cell size due to the more complicated write process and inadvertent switching of elements elsewhere on the bit or word lines due to materials variations and the half-select addressing scheme. The most serious limitation, however, is that MTJ-MRAM suffers from poor scaling of the current density necessary to produce the write field as the wires are made smaller and the coercivity of the soft electrode is increased to avoid superparamagnetism. For example, to scale to the 20 nm node, a cube-shaped magnetic bit needs an anisotropy energy (Ku) of Ku=50 kBT/V=2.8×105 ergs/cm3 where T/V is temperature over volume. Assuming a magnetization of 1000 emu/cm3, the anisotropy field (Hk) would need to be Hk=2 Ku/M=570 Oe where M is magnetization. In the Stoner-Wohlfarth model of magnetic reversal, we can take Hk to be approximately equal to the field necessary for fast switching. For 20 nm×20 nm bit and word wires (at 45 degrees to the magnetic axis) to produce 570 Oe 20 nm from their centers, the current density would need to be at least j=(5/21/2)Hk/d=1×109 A/cm2 where d is the height and width. Assuming the copper bit and word lines are 256 cells long (10 mm), the voltage would be V=jrL=2 volts, where j is the current density, r is the resistivity, and L is the length of the line. The power would be P=2 Vjd2=16 mW. Problems of electromigration and power dissipation at such large current densities seem to preclude the practical use of field-induced MTJ writing at the 20 nm node (and perhaps well before this node is reached).

Preferably, current densities should be kept as low as possible (on the order of $10^7$ A/cm$^2$). Current densities are kept low by passing current directly through the MTJ as fields are applied with the word and bit lines. Power dissipation (P=$I^2$R) then heats the free electrode and temporarily reduces $H_k$ during writing. After cooling, $H_k$ increases to its original value to ensure long term thermal stability of the written bit. Specific numerical examples illustrating the invention are given below. Thermally-assisted MTJ writing also solves the half-select problem. In MTJ writing, half of the field is provided by the word line and half from the bit line. This means that the other cells on the bit and word lines experience half of the field as the one at the intersection. Sometimes these accidentally switch. Using thermal-assist avoides the half-select problem of the traditional MTJ architecture since current is only passed through the junction to be written (for example by using a FET). Therefore, with the invention $H_k$ is only reduced for one junction.

A spin-polarized current can also be used for magnetic switching by spin transfer. Spin transfer occurs when a spin current component transverse to the magnet magnetization direction is absorbed at the surface of a magnet. For the particular case illustrated in FIG. 1, a nonmagnetic metallic spacer 120 is inserted between a thick stable magnet 140 and a thin "free" magnet 130. The magnetic layers 130, 140 have anisotropy perpendicular to the plane of the layers which dominates applied, exchange, and demagnetization fields (another version of the device has magnetization in the plane). Current is passed from the thick magnet 140 to the thin magnet 130 and a current polarized in the direction of the thick magnet impinges on the thin magnet. No spin transfer occurs for parallel or anti-parallel magnetization. However, any small deviation in the direction of the thin magnet (due to thermal motion or imperfections) results in a spin current transverse to the free magnet direction at the interface between the nonmagnetic spacer 120 and the free magnet 130. The transfer of this angular momentum results in a torque on the magnetic moment of the free electrode 130. This torque causes the magnetization direction150 to rotate up and to precess about the anisotropy direction. If the transfer of angular momentum is faster than the damping of the precessing moment, the canting will increase until reversal takes place. The free electrode moment can be switched back by passing current in the opposite direction since the current becomes spin-polarized by the free electrode. Angular momentum is lost due to absorption of transverse spin current at the interface of the spacer and thick electrode. Angular momentum is then lost in such a way as to favor anti-alignment Assuming that the free electrode perpendicular anisotropy dominates the shape anisotropy (demagnetization fields favor in-plane magnetization), and the "thick" or "hard" electrode 140 and the spacer 120 are designed for low exchange and magnetostatic fields (the thick electrode 140 may actually comprise many layers in order to accomplish this), the critical current necessary for switching is: I=$\alpha e \gamma S H_k/g$. In this equation, $\alpha$ is the Gilbert damping parameter, e is the electron charge, $\gamma$ is the gyromagnetic ratio, S is the total spin of the free electrode, and g is a parameter that depends on the spin current polarization. Since S=MV/$\gamma\hbar$ and $H_k$=2 $K_u$/M (assuming a Stoner-Wohlfarth model), the critical current density is j=2$\alpha$et$K_u$/g$\hbar$ where t is the free electrode thickness. At the 20 nm node, superparamagnetism must be avoided so t$K_u$>50 $k_B$T/A=0.6 erg/cm$^2$ (for example $K_u$=3×10$^6$ erg/cm$^3$ at 330 K and t=2 nm). If the polarization is 0.35 (typical of pure cobalt), then g=0.2.

For bulk cobalt and other high quality metallic magnets a can be less than 0.01, however it has been found that 0.04<$\alpha$<0.2 in cobalt thin films (20 nm thick) and nano-constrictions suggesting that magnetic damping can be very large near surfaces. If $\alpha$=0.04 for a 2 nm thick film, then the critical current density is 4×10$^7$ A/cm$^2$. This value cannot be reduced by making the film thinner because $K_u$ would then have to be larger to avoid superparamagnetism. In order to have fast switching the current density will need to be larger than this since the effective damping torque must be exceeded by the spin torque. The required additional current density is j$_{switch}$=eMt/($\gamma\hbar$g$\tau$) where $\tau$ is the switching time. If t=2 nm, $\tau$=1 ns and M=200 emu/cm$^3$ (the magnetization of cobalt is 1400 emu/cm$^3$), then j$_{switch}$=1×10$^7$ A/cm$^2$. For an out-of-plane device, this low magnetization would be desirable so that in-plane shape anisotropy does not dominate. Shape anisotropy gives an effective energy density of 2 $\pi M^2$=2.5×10$^5$ ergs/cm$^3$ which is more than ten times smaller than $K_u$ in this example.

In the structure shown in FIG. 1, the total required current density for a spin transfer device at the 20 nm node is 5×10$^7$ A/cm$^2$, assuming the material has the polarization of cobalt, seven times less moment than cobalt, high anisotropy, and low Gilbert damping. Even with optimistic assumptions, the current density of the structure shown in FIG. 1 is undesirably large and may lead to problems of electromigration and failure of the device over time.

In the device depicted in FIG. 1, the resistance is too low because it is an all-metal device. Experimentally, the resistance of a simple seven layer device is about 0.01 $\Omega$-$\mu m^2$ and the resistance change is about 0.001 $\Omega$-$\mu m^2$. At the 20 nm node this resistance change is 2.5 $\Omega$ while the copper bit lines (assuming 256 cell length) would have a resistance of R=$\rho$L/A=500 $\Omega$ and $\Delta$R/R=0.005, where $\Delta$R represents the difference in resistance and L is the length of the wire. Detecting such a small signal would be difficult. It is necessary for the bit lines to be this long so that all the electronics associated with the writing and reading does not take up too much chip real estate as compared with the memory cells. This problem is much worse at larger length scales since the wire resistance drops linearly with feature size while the device resistance drops as the square of the feature size (thus, at the 100 nm node, $\Delta$R/R=0.001). Ideally, the resistance needs to be increased by a factor of at least 20. One way to increase the resistance is to put thin porous oxide layers at one or more of the interfaces (for example between the stable electrode and the nonmagnetic metallic spacer). This has the effect of crowding the current through the pores and decreasing the effective area of the device. Unfortunately, this also increases the local current density. For example, to increase the resistance by a factor of 20, the pores should occupy 5% of the area and the local current density would have to be about $1\times10^9$ A/cm$^2$ for our 20 nm node design. Thus, problems with high current density could be made worse.

Figure 2:
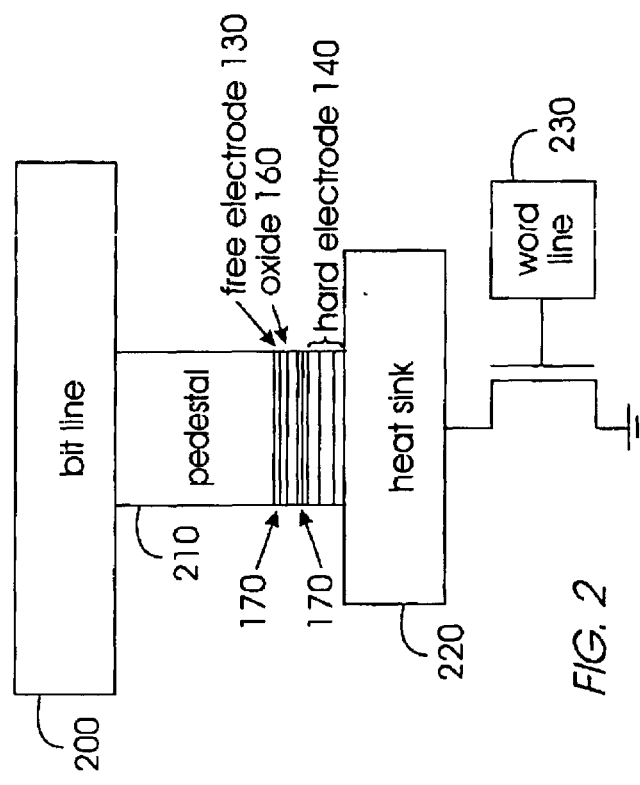
FIG. 2 is a schematic diagram of a magnetic random access memory structure.

In one embodiment, the problems described above are solved by replacing the metallic spacer 120 with an insulator barrier 160 such as an oxide (as shown in FIG. 2) to increase the resistance (preferably without current crowding), optimizing the resistance and thermal properties to temporarily reduce anisotropy through current-induced heating, and optimizing the free-layer materials to have a large reduction in anisotropy for a small temperature change so that the critical current density is significantly reducing during writing. The oxide layer 160 preferably has a resistance between 0.2 W-lm2 and 20 W-lm2. FIG. 2 also illustrates the bitline 200 and wordline 230, the heatsink 220, pedestal (electrical contact) 210, and a transistor 240. Thus, the device shown in FIG. 2 is a MTJ with current-induced 29switching by a combination of spin transfer and thermal assist (e.g., greater than 500 C change).

This embodiment can also take advantage of the use of porous oxides as opposed to the continuous pin-hole free layer oxide barrier 160 discussed above. As mentioned above, one way to increase the resistance is to put thin porous oxide layers at one or more of the interfaces. This has the effect of crowding the current through the pores and decreasing the effective area of the device. Therefore, FIG. 2 also illustrates optional non-magnetic metalic spacers 170 that could be placed on either side (or on both sides) of the oxide barrier 160 if the oxide barrier were a porous oxide barrier. The non-magnetic metalic spacers 170 could be between the oxide barrier 160 and either of (or both) the free and stable electrodes 130, 140. The porous oxide 160 does not have to be positioned between the magnetic electrodes 130, 140. Instead, the porous oxide 160 could just be nearby the magnetic electrodes, as long as current spreading through the pores of the insulator 160 is not too great before reaching the free electrode and the power dissipation at the oxide causes heating of the free electrode The concept of spin transfer was first considered in the context of a tunnel barrier but was rejected as not being possible due to excessive heating at the resistance values typically associated with MTJs. Fortunately, a great deal of work has gone into reducing MTJ resistance for use as a sensor in magnetic heads and pin-hole free devices can now be made with resistance less than 10 $\Omega$-$\mu m^2$ and $\Delta$R/R is greater than 0.2.

The geometry shown in FIG. 2 is also novel. Notice that the FET 240 allows bi-directional current flow. Also, the hard 140 and free electrodes 130 may comprise multiple layers to optimize their magnetic properties and couplings one of which could be a TbFeCo alloy. The invention can include anti-ferromagnetic pinning layers and synthetic ferrimagnets for the hard electrode and "capping" layers for the free electrode. The device could write at $1\times10^8$ A/cm$^2$ at the 20 nm node without thermal assist. The optimal resistance for such a device in terms of read back signal and power dissipation is about equal to the bit line resistance of 500 $\Omega$ (assuming a length of 256 cells) corresponding to 0.2 $\Omega$-$\mu m^2$. Assuming such a low resistance MTJ could be made without pinholes (or a porous oxide device could be made with good $\Delta$R/R) and such high current densities could be sustained, the power would be 80 $\mu$W in the junction and 80 $\mu$W in the bit line or 160 $\mu$W total.

Assuming the pedestal 210 is 20 nm tall with thermal conductivity of 100 W/mK (typical of a pure good metal), and half the junction power is deposited on the tree electrode 130 (40 $\mu$W), the temperature rise would be $\Delta$T=Ph/KA=20 K where h is the height of the pedestal, P is the power and K is the thermal conductivity. Here the temperature rise is estimated by assuming the barrier is an effective thermal insulator and solved a simple 1-dimensional heat flow problem. The conclusion is that current densities of the order $10^8$ A/cm$^2$ can cause problems of electromigration, high power requirements, low signal levels, and resistance values that are difficult to attain in a 20 nm device. However, MTJ writing with spin transfer and without thermal assist is much more reasonable at the 40 nm node since the critical current scales with the inverse of the area according to $tK_u$>50 $k_B$T/A. Parameters that might be possible for a 40 nm device without thermal assist would be: t=2 nm, $K_u$=7.5$\times10^5$ erg/cm$^3$, $\alpha$=0.04, g=0.2, $j_{crit}$=1$\times10^7$ A/cm$^2$, M=100 emu/cm$^3$, $\tau$=1 ns, $j_{switch}$=5$\times10^6$ A/cm$^2$, $j_{total}$=1.5$\times10^7$ A/cm$^2$, I=0.24 mA, R=1 $\Omega$-$\mu m^2$=625 $\Omega$, V=0.15 Volts, P=36 $\mu$W, h=40 nm, K=100 W/mK, $\Delta$T=4.5 K. In order to achieve this, it will be necessary to have a material with low damping, high polarization, and low moment. Thus, the invention lowers the resistance of the insulator 160 to provide a low resistance tunnel barrier. This low resistance tunnel barrier allows a sufficiently high current density to exist that spin-transfer-based writing occurs without voltage breakdown or overheating.

Now consider the device designed to write at $1\times10^7$ A/cm$^2$ at the 20 nm node with thermal assist shown in FIG. 2. For a resistance of 4 $\Omega$-$\mu m^2$=10 k$\Omega$ and voltage of 0.4 V, total power is 16 $\mu$W (power in the bit line would be very small at this current). For a pedestal height of 50 nm, thermal conductivity of 10 W/mK (typical of many alloys), and assuming half the power is dissipated on the free electrode 130, the temperature rise would be 100 K. Furthermore, the thermal time constant can be estimated as $\tau_{thermal}$=h$^2$C/K= 0.75 ns where C is the heat capacity (assumed to be 3$\times10^6$ J/m$^3$). Therefore, the inventive device is very fast. Notice that the power is about 10 times less than the non-thermal assist case (assuming $1\times10^8$ A/cm$^2$) and 1000 times lower than the field-induced MTJ writing without thermal assist.

This analysis shows that the combination of MTJs, spin-torque, and thermal assist can allow for devices that are small, fast, power efficient, and have ideal resistance values for large signals and CMOS integration.

In another embodiment, magnetic fields from currents passing though the bit and word lines can assist in the switching. For example, with a current density of $1 \times 10^8$ A/cm$^2$ passing though these lines in our 20 nm node design, a field of about 60 Oe can be created. The MTJ current of $1 \times 10^7$ A/cm$^2$ heats the bit to reduce the anisotropy to less than 60 Oe for writing. Also, power is reduced by a factor of 100 compared to the best case without thermal assist and problems with the half-select addressing are avoided.

Figure 3:
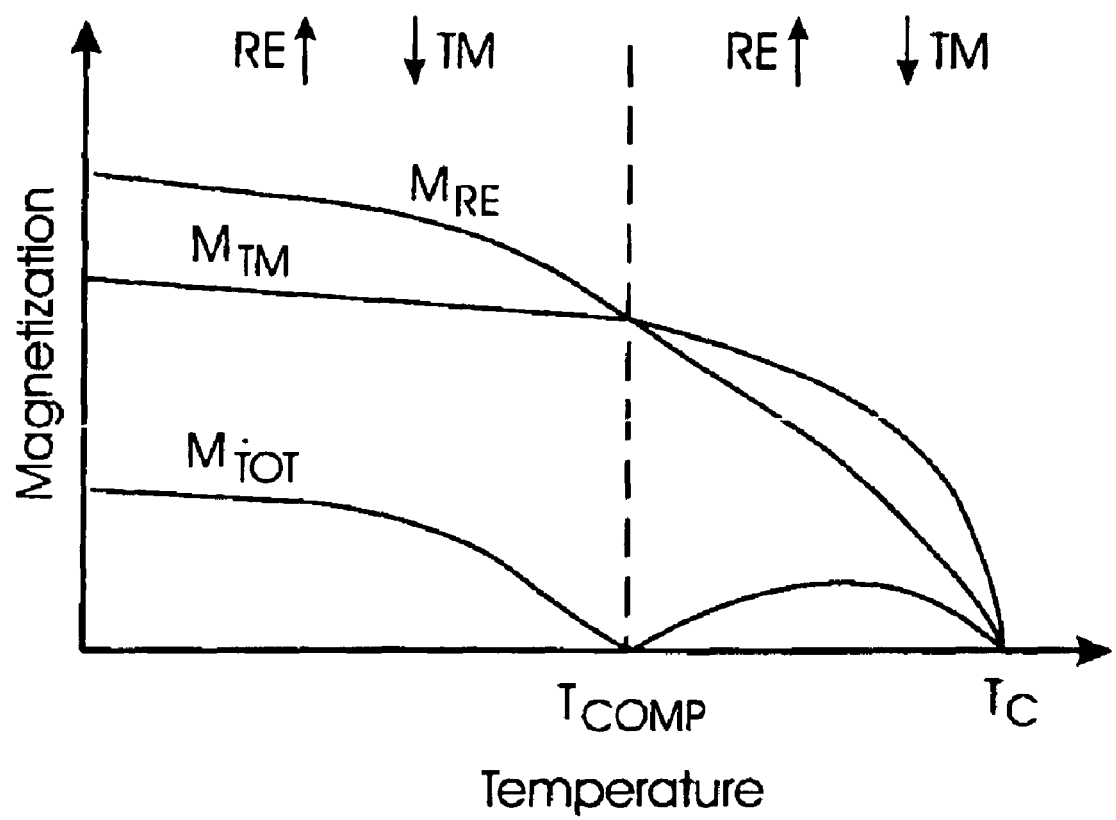
FIG. 3 is a graph showing the relationship between temperature and magnetization for a magnetic alloy.

One class of materials that are: ideally suited for use in the free electrode 130 are the ferromagnetic RE-TM alloys such as "amorphous" TbxFey with Gd, Co, and other elements optionally added in small quantities to tailor the properties. In TbxFey, the rare earth (RE) Tb and transition metal (TM) Fe magnetizations oppose each other and have different temperature dependencies. When x equals 0.1, the TM magnetization dominates while for x=0.3, the RE magnetization dominates. When x equals about 0.22, the magnetization cancels (compensated) at room temperature (indicated by the dashed line $T_{COMP}$ in FIG. 3) and then rises with temperature (to point $T_C$ in FIG. 3) as the magnetization of the TM subnetwork becomes larger than that of the RE subnetwork (indicated by the size of the magnetization vector in FIG. 3). Because the total magnetization of the ferrimagnets is very small (typically less than 300 emu/cm3), the critical currents are likely to be smaller than for other materials making them attractive even without thermal assist. TbxFey alloys have tunable perpendicular anisotropy of up to $1.5 \times 10^7$ erg/cm3 at 300 K dropping to zero at the Curie temperature around 400 K. This large anisotropy and low Curie point make this type of material very attractive for the present invention (even a 10 nm×10 nm×2 nm free electrode would be thermally stable). Low magnetization guarantees out-of-plane magnetization. In the example given above for a 20 nm thermal assist device, dissipation caused by the tunneling current heats the free electrode to 400 K in less than 1 ns with only 16 $\mu$W of power. It is important to understand the temperature dependent critical current near the Curie temperature. Taking g-P3/2 for small P, the critical current density is: j(T)Ku(T)/P(T)3/2 and Ku(T)-MRE(T)2 can be taken. Since the magnetic electrons of the RE are in the 4f shell far from the Fermi level and the magnetic electrons of the TM are in the 3d shell (at the Fermi level), the polarization can be primarily determined by the TM magnetization. Assuming P(T)·MTM(T), produces j(T)-MRE(T)2/MTM(T)3/2. Notice that this appears to be less favorable than field-induced writing since in this case j(T)·Hk·MRE(T)2/MTM(T). However, the worst case is taken here since the hard electrode could be effectively heat sunk and made from materials with a low temperature response and high Curie temperature, where only the polarization of the free electrode would drop significantly. Even so, since the exponent is larger in the numerator and MRE drops faster than MTM, this shows the critical current will drop dramatically as the temperature is raised. If the free electrode is heated to the Curie point and cooled, writing will occur at the most favorable temperature (just below the Curie point).

Thus, as shown above, with the invention, thermally-assisted magnetic writing is accomplished by passing current through an ultra-low resistance oxide layer adjacent or near to a free electrode to be switched. Current-induced heating lowers the anisotropy of the free electrode and reduces the current density required for field or spin-transfer-based writing. The invention provides a non-volatile MRAM memory device with excellent durability, current-controlled switching, excellent scalability, ultra-fast switching speeds, very small bit cell, low voltage, low power, and optimal resistance for CMOS integration.

While the invention has been described in terms of preferred embodiments, those skilled in the art will recognize that the invention can be practiced with modification within the spirit and scope of the appended claims.

What is claimed is:

1. A non-volatile magnetic random access memory (MRAM) device comprising:

a stable magnetic electrode;

an insulator layer; and a free magnetic electrode, wherein said insulator layer is between said stable magnetic electrode and said free magnetic electrode;

wherein said insulator layer has a resistance at levels to allow sufficient power dissipation to heat said free magnetic electrode to lower anisotropy of said free magnetic electrode through current induced heating; and wherein said heating assists in switching said free magnetic electrode to write information in said MRAM device and reduces the current density required to a value lower than that required in the absence of said heating.

2. The device in claim 1, wherein said stable magnetic electrode comprises one or more layers.

3. The device in claim 1, wherein said heating current is spin-polarized and occurs at a level to allow spin-transfer-based writing to occur in said free magnetic electrode.

4. The device in claim 1, further comprising bit and word lines connected to said free magnetic electrode and' said stable magnetic electrode, wherein said heating current in combination with magnetic field from current passing through said bit and word lines switches said free magnetic electrode.

5. The device in claim 1, said insulator layer has thermal properties, and wherein said resistance and said thermal properties are optimized to temporarily reduce said anisotropy through said current-induced heating.

6. The device in claim 1, wherein a material selection for said free magnetic electrode is optimized to have an increased reduction in anisotropy for a small temperature change to allow a critical current density to be reducing during writing of said information.

7. A non-volatile magnetic random access memory (MRAM) device comprising:

a stable magnetic electrode;

an insulator layer connected to said stable magnetic electrode, wherein said insulator layer is continuous and free of pin holes; and a free magnetic electrode connected to said insulator layer, wherein said insulator layer is between said stable magnetic electrode and said free magnetic electrode;

wherein said insulator layer has a resistance at levels to allow sufficient power dissipation to heat said free magnetic electrode to lower anisotropy of said free magnetic electrode through current induced heating; and wherein said heating assists in switching said free magnetic electrode to write information in said MRAM device and reduces the current density required to a value lower than that required in the absence of said heating.

8. The device in claim 7, wherein said stable magnetic electrode comprises one or more layers.

9. The device in claim 7, wherein said heating current is spin-polarized and occurs at a level to allow spin-transfer-based writing to occur in said free magnetic electrode.

10. The device in claim 7, further comprising bit and word lines connected to said free magnetic electrode and said stable magnetic electrode, wherein said heating current in combination with magnetic field from current passing through said bit and word lines switches said free magnetic electrode.

11. The device in claim 7, said insulator layer has thermal properties, and wherein said resistance and said thermal properties are optimized to temporarily reduce said anisotropy through said current-induced heating.

12. The device in claim 7, wherein a material selection for said free magnetic electrode is optimized to have an increased reduction in anisotropy for a small temperature change to allow a critical current density to be reducing during writing of said information.

13. A non-volatile magnetic random access memory (MRAM device comprising:
a stable magnetic electrode;
a porous insulator layer;
a non-magnetic layer adjacent said insulator layer; and
a free magnetic electrode, wherein said insulator layer and said non-magnetic layer are between said stable magnetic electrode and said free magnetic electrode;
wherein said insulator layer has a resistance at levels to allow sufficient power dissipation to heat said free magnetic electrode to lower anisotropy of said free magnetic electrode through current induced heating; and
wherein said heating assists in switching said free magnetic electrode to write information in said MRAM device and reduces the current density required to a value lower than that required in the absence of said heating.

14. The device in claim 13, wherein said stable magnetic electrode comprises one or more layers.

15. The device in claim 13, wherein said heating current is spin-polarized and occurs at a level to allow spin-transfer-based writing to occur in said free magnetic electrode.

16. The device in claim 13, further comprising bit and word lines connected to said free magnetic electrode and said stable magnetic electrode, wherein said heating current in combination with magnetic field from current passing through said bit and word lines switches said free magnetic electrode.

17. The device in claim 13, said insulator layer has thermal properties, and wherein said resistance and said thermal properties are optimized to temporarily reduce said anisotropy through said current-induced heating.

18. The device in claim 13, wherein a material selection for said free magnetic electrode is optimized to have an increased reduction in anisotropy for a small temperature change to allow a critical current density to be reducing during writing of said information.

19. A method of manufacturing a non-volatile magnetic random access memory (MRAM) device, said method comprising:
forming stable magnetic electrode;
forming an insulator layer on said stable magnetic electrode; and forming a free magnetic electrode on said insulator layer such that said insulator layer is between said stable magnetic electrode and said free magnetic electrode;
wherein said forming of said insulator layer is performed such that said insulator layer has a resistance at levels to allow sufficient power dissipation to that said free magnetic electrode to lower anisotropy of said free magnetic electrode through current induced heating; and
wherein said heating assists in switching said free magnetic electrode to write information in said MRAM device and reduces the current density required to a value lower than that required in the absence of said heating.

20. The method in claim 19, wherein said forming of said stable magnetic electrode comprises forming one or more layers.

21. The method in claim 19, wherein said heating current is spin-polarized and occurs at a level to allow spin-transfer-based writing to occur in said free magnetic electrode.

22. The method in claim 19, further comprising forming bit and word lines connected to said free magnetic electrode and said stable magnetic electrode, wherein said heating current in combination with magnetic field from current passing through said bit and word lines switches said free magnetic electrode.

23. The method in claim 19, said forming of said insulator layer is performed such that said insulator layer has thermal properties, and wherein said resistance and said thermal properties are optimized to temporarily reduce said anisotropy through said current-induced heating.

24. The method in claim 19, wherein a material selection for said free magnetic electrode is optimized to have an increased reduction in anisotropy for a small temperature change to allow a critical current density to be reducing during writing of said information.

25. A non-volatile magnetic random access memory (MRAM) device comprising:
a stable magnetic electrode;
an insulator layer connected to said stable magnetic electrode, wherein said insulator layer is continuous and free of pin holes; and
a free magnetic electrode connected to said insulator layer, wherein said insulator layer is between said stable magnetic electrode and said free magnetic electrode,
wherein said insulator layer has a resistance level that allows a sufficient current density to exist that spin-transfer-based writing is promoted in said free magnetic electrode.

26. The device in claim 25, wherein said stable magnetic electrode comprises one or more layers.

27. The device in claim 25, further comprising bit and word lines connected to said free magnetic electrode and said stable magnetic electrode, wherein said spin-transfer-based writing in combination with a magnetic field from current passing through said bit and word lines switches said free magnetic electrode.

28. The device in claim 25, wherein damping, polarization, and moment properties of said insulator layer are optimized to promote said spin-transfer-based writing.

29. The device in claim 25, wherein said spin-transfer-based writing occurs without voltage breakdown or overheating.

* * * * *